(12) United States Patent
Takei et al.

(10) Patent No.: US 6,396,349 B2
(45) Date of Patent: May 28, 2002

(54) TRAVELING WAVE POWER COMBINER AND RADIO BASE STATION

(75) Inventors: Ken Takei, Kawasaki; Masami Ohnishi, Hachioji; Kenji Sekine, Nishitama-gun, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/812,780

(22) Filed: Mar. 15, 2001

Related U.S. Application Data

(63) Continuation of application No. 09/364,033, filed on Jul. 30, 1999, now Pat. No. 6,236,272.

(30) Foreign Application Priority Data

Mar. 18, 1999 (JP) .......................................... 11-073109

(51) Int. Cl.$^7$ ................................................. H03F 3/60
(52) U.S. Cl. ................... 330/286; 330/124 R; 330/151; 455/63
(58) Field of Search ................................ 330/286, 295, 330/124 R, 53, 151, 149; 455/63

(56) References Cited

U.S. PATENT DOCUMENTS

| | | | |
|---|---|---|---|
| 4,412,185 A | 10/1983 | Gerard | |
| 4,797,628 A | * 1/1989 | Gruchalla et al. | 330/54 |
| 5,274,339 A | * 12/1993 | Wideman et al. | 330/54 |
| 5,367,267 A | * 11/1994 | Fuchs | 330/54 |
| 5,414,387 A | 5/1995 | Nakahara et al. | |
| 5,489,875 A | 2/1996 | Carvers | |
| 5,561,397 A | 10/1996 | Kumar et al. | |
| 5,610,554 A | * 3/1997 | Anvari | 330/52 |
| 6,011,434 A | * 1/2000 | Sakai | 330/151 |
| 6,052,023 A | 4/2000 | Myer | |
| 6,078,800 A | 6/2000 | Kasser | |
| 6,094,096 A | 7/2000 | Myer | |

* cited by examiner

Primary Examiner—Robert Pascal
Assistant Examiner—Henry Choe
(74) Attorney, Agent, or Firm—Antonelli, Terry, Stout & Kraus, LLP

(57) ABSTRACT

A power combiner having a plurality of power amplifiers which are even-numbered, a plurality of series-connected branch circuits for respectively distributing input power to the plurality of power amplifiers, and a plurality of series-connected combiners for combining the respective output power of the plurality of power amplifiers. In the case of any one of such combinations as to equalize electric lengths of transmission lines for connecting between two power amplifiers selected from the plurality of power amplifiers, the combinations each being established by using all of the plurality of power amplifiers once, the electric lengths at which the any one of the combinations are established, take $\lambda/2i$ (where $\lambda$=wavelength of fundamental wave, and $i$=positive integer).

14 Claims, 17 Drawing Sheets

Linearized Power Amplifier

Main Power Amplifier

| kth harmonic | Δ φ | L |
|---|---|---|
| 2 | φ | $\lambda/2$ |
| 3 | 2φ | $\lambda/4$ |
| 4 | 3φ | $\lambda/6$ |
| 5 | 4φ | $\lambda/8$ |

(1) ×4

(2) ×6

(3) ×8

(4) ×10

TRAVELING WAVE POWER COMBINER AND RADIO BASE STATION

CROSS REFERENCE TO RELATED APPLICATION

This is a continuation of U.S. application Ser. No. 09/364,033, filed Jul. 30, 1999, now U.S. Pat. No. 6,236,272, the subject matter of which is incorporated by reference herein.

BACKGROUND OF THE INVENTION

A distribution power combiner of such a type as explained in the Microwaves & RF vol. 8, pp107–112 1998 has been known as a power combiner applied to a power amplifier of a cellular base station. FIG. 18 shows a circuit configuration of the conventional distribution power combiner. A combining number will be defined as n. A RF signal applied from an input terminal 7 is distributed to respective amplifiers 101-1 through 101-n by branch circuits 103-1 through 103-(n−1) in sequence. The RF signals amplified by the respective amplifiers 101 are sequentially combined into one by combiners 102-1 through 102-(n−1), after which the combined one is outputted to an output terminal 8.

In order to bring out the full linearity of a semiconductor device used in each amplifier 101, it is desirable to reduce the maximum power inputted to each amplifier 101, i.e., equalize respective power inputted to the respective amplifiers 101. At this time, the power to be amplified by the respective amplifiers 101 become equal to each other.

Power distribution ratios for equalizing the power inputted to the respective amplifiers 101 are represented every branch circuits. If power inputted to an input transmission line 106 from the input terminal 7 is defined as n, it is then necessary to distribute power to be inputted to the first amplifier 101-1 and power to be inputted to the second branch circuit 103-2 in a ratio of 1:(n−1). Distribution ratios to other branch circuits are determined in a similar relationship.

On the other hand, if power outputted from the output terminal 8 through an output transmission line 107 is defined as n, it is then necessary to combine first power outputted from the nth amplifier 101-n and (n−1)th power outputted from the n−1th combiner 102-(n−1) into one. Distribution ratios to other combiners are determined in a similar relationship.

SUMMARY OF THE INVENTION

Such a prior art is accompanied by a problem that compensation for the linearity of each amplifier 101 is not taken into consideration and a power component of harmonic components caused by distortion developed in each amplifier is outputted from the output terminal 8 of the power combiner. Thus, in the conventional power amplifier, a filter for cutting off these harmonic components must be inevitably connected to a stage subsequent to the power combiner. The efficiency of power has been impaired as the entire power combiner including the filter due to an insertion loss produced by the insertion of the filter.

In the aforementioned prior art, the branching and combining of power have been performed by directional couplers. As the prior art that performs the branching and combining of the power, there is known one utilizing impedance ratios between lines in addition to the directional couplers. The branching and combining of the power are performed according to the impedance ratios between the lines. If the first branch circuit 103-1 is explained by way of example, then the characteristic impedance of a line extending from the input terminal 7 to a first connecting point, the characteristic impedance of a line extending from the first connecting point to the first power amplifier, and the characteristic impedance of a line extending from the first connecting point to the second branch circuit (second connecting point) may be defined as $Z0/n$, $Z0$ and $Z0/(n-1)$ respectively.

However, when the branching and combining of the power are performed according to the impedance ratios between the lines, isolation is insufficient between the plurality of amplifiers 101 while the circuit can be constructed at low cost as compared with the use of the directional couplers. Therefore, there is the potential that since the relationship in impedance between the distribution power amplifiers are disturbed when characteristic changes occur in any or more of the amplifiers 101, the efficiency of power combining will be greatly impaired. There is also a possibility that if one amplifier develops trouble and the input/output impedance thereof becomes infinite, then the output impedances of other amplifiers rise and the power reflected onto each amplifier increases, thus causing trouble that the amplifiers will be destroyed due to the reflected power on a chain reaction basis.

In a travelling wave power combiner, power are not combined into one if power outputted from respective amplifiers are not kept in balance. In the travelling wave power combiner according to the present invention, harmonics outputted from amplifiers are canceled out while the power outputted from the respective amplifiers are being kept in balance.

The principle of the present invention is shown in FIGS. 19A and 19B. The lengths (electric lengths) of transmission lines for connecting between branch circuits or between combiners will be defined as L (for simplification, the branch circuits and combiners are omitted in the drawing). FIG. 19A shows the relationship between the differences in phase between kth harmonics developed in an output point 1901 and line lengths L for canceling out the phase differences. The wavelength of a fundamental wave is defined as $\lambda$ and a phase shift of $\phi$ will be developed due to each line length L. If the phase of an input point 1900 is defined as the reference, a kth harmonic developed from a first amplifier 1902 produces a phase shift of $k\phi$ at the output point 1901 through a transmission line 1905. On the other hand, a kth harmonic produced from a second amplifier 1903 produces a phase shift of $\phi$ at the output point 1901 through a transmission line 1904. Thus, the phase difference $\Delta\phi$ at the output point 1901 between the kth harmonics developed in the two amplifiers results in $(k-1)\phi$. When the phase of the kth harmonic from the first amplifier 1902 and the phase of the kth harmonic from the second amplifier 1903 are reversed, their kth harmonics are canceled out. In the case of $\Delta\phi=\lambda/2$, the phases of the kth harmonics from the two amplifiers are inverted. Line lengths in this case are shown so as to correspond to second to 5th harmonics.

On the other hand, it is necessary to keep the power outputted from the respective amplifiers in balance with a view toward functioning as the travelling wave power combiner. This means that the combining or cancellation of the power (fundamental waves or harmonics) outputted from the respective amplifiers need to be equally executed for all the amplifiers. If, for example, harmonics from only some of the amplifiers in the travelling wave power combiner are canceled out, there is then a difference in magnitude between fundamental-wave outputs of the harmonics-canceled amplifiers and the amplifiers free of the cancellation of the harmonics, whereby the combiner is kept off-balance.

In order to make combinations of the amplifiers for canceling the harmonics, the number of the amplifiers contained in the travelling wave power combiner is set to a even number. Examples of 4-combining (1), 6-combining (2), 8-combining (3) and 10-combining (4) are shown in FIG. 19B. If the 4-combining are taken, for example, then the number of combinations of the amplifiers used for cancellation is two. The first combination is amplifiers {(1, 2), (3, 4)} and the second combination is amplifiers {(1, 3), (2, 4)}. Thus, a transmission-line length (electric length) between the amplifiers (1, 2) or a transmission-line length between the amplifiers (1, 3) may be defined as a transmission-line length (=λ/(2(k−1)) for canceling the kth harmonic. If the transmission-line length between the amplifiers (1, 2) is set to λ/8, for example, then a 5th harmonic is canceled out by the amplifiers (1, 2) and a 3rd harmonic is canceled out by the amplifiers (1, 3). In regard to these combinations, the transmission lines for connecting between the amplifiers are equal in electric length to each other.

It is further necessary for the travelling wave power combiner including the even-numbered amplifiers that a plurality of ways to make the combinations of the amplifiers for canceling harmonics exist and the harmonics are canceled out for all possible combinations. If even some of the possible combinations cannot cancel out the harmonics, then a difference in magnitude occurs between the outputs of the fundamental waves and hence the combiners are kept off-balance. In the example illustrated in FIG. 19B, the transmission-line lengths between the respective adjacent amplifiers are set equal to each other. In this case, the harmonics may be canceled out in the case of any combination of other than the adjacent amplifiers.

It is desirable that the combinations of non-adjoining amplifiers are determined according to the transmission-line lengths. In this case, the entire circuit can be constructed in compact form. Further, since the power of the high-order harmonics outputted from the amplifiers is generally high in energy as the order of harmonics decreases, it is desirable to cancel out lower-order harmonics, particularly, the second and third harmonics. It is practical that as will be described later, the third harmonics can be canceled out in the combinations of the non-adjoining amplifiers.

Since the harmonics to be canceled out are kept in balance on an amplitude basis and outputted from the respective amplifiers whose characteristics are the same, they are not outputted to the output terminal of the travelling wave power combiner. Thus, in the power amplifier, the connection of the filter for cutting off the harmonic components to the stage subsequent to the travelling wave power combiner becomes unnecessary, whereby an impairment in the power efficiency due to an insertion loss produced by the insertion of the filter is solved.

These and other objects and many of the attendant advantages of the invention will be readily appreciated as the same becomes better understood by reference to the following detailed description when considered in connection with the accompanying drawings.

DETAILED DESCRIPTION OF THE PREFERRED EMBODIMENTS

Figure 16A:
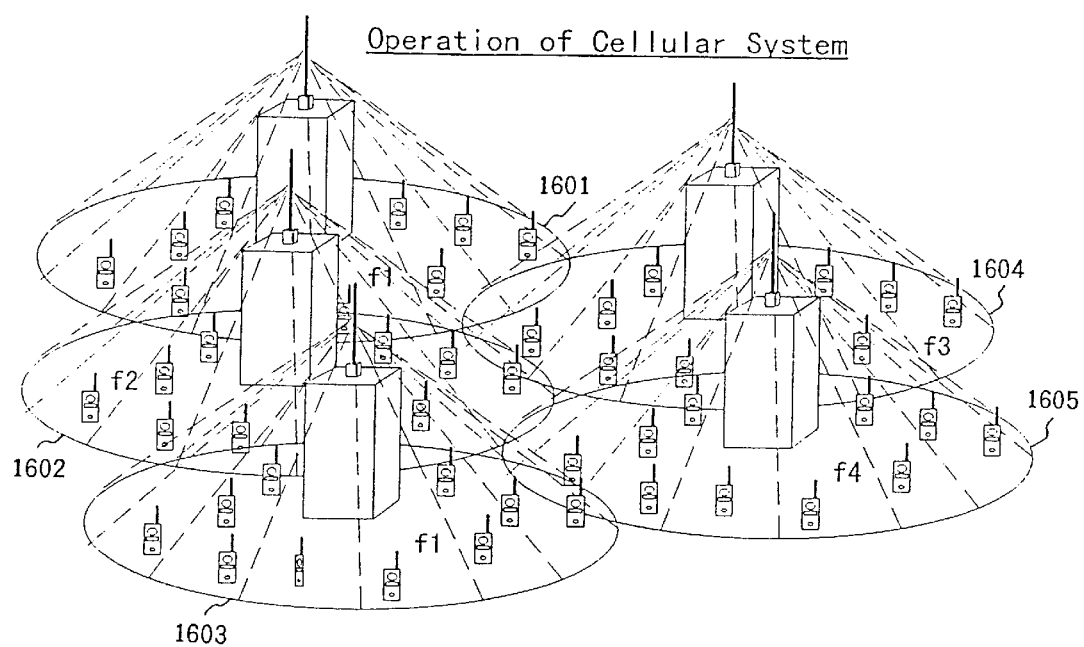
FIG. 16A is a diagram showing a structure of a cellular system.
Figure 16B:
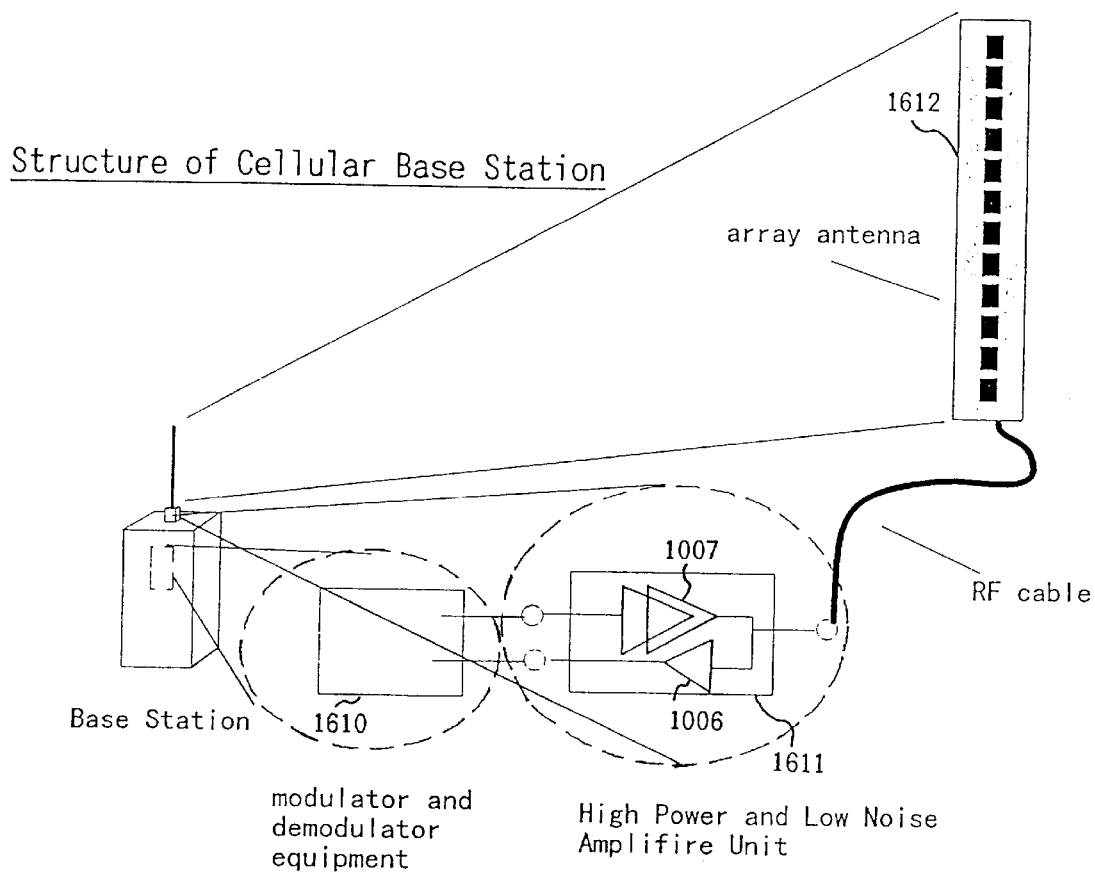
FIG. 16B is a diagram illustrating a structure of a cellular base station.

A cellular system shown in FIG. 16A is adopted to repeatedly use limited frequencies with efficiency and increase the capacity of subscribers held or accommodated by the system in the mobile communication. In the cellular system, the directivity of an antenna is sharpened to localize an achievable distance of a radio wave transmitted or emitted from one base station (cells 1601 through 1605), whereby the same frequency is spatially re-used. For example, the same frequency f1 is used between the cells 1601 and 1603. A structure of the base station is shown in FIG. 16B. A signal supplied from a base band signal processing device (not shown) is transformed into a frequency (carrier frequency) capable of propagating through space as a radio wave by modulation demodulation equipment 1610. A transmitting/receiving amplifier 1611 amplifies the power of a transmitting/receiving signal to allow the radio wave to reach each terminal lying within the corresponding cell (on the transmitting side) or to extract a weak signal sent from the terminal (on the receiving side). The signal amplified by a transmitting power (linearized) amplifier 1007 is transmitted to each cell as power having a sharp directivity formed by an array antenna 1612.

In the current cellular mobile communication system, the achievable distance of a radio wave sent or emitted from a base station is a few km to about 20 km, the frequency to be used ranges from several hundreds of MHz to a few GHz, and radiation power of one terminal ranges from several hundreds of mW to about 2W in terms of a demand for a size reduction in terminal, the amount of information transmission required by the system and space attenuation characteristics of an electromagnetic wave. In this case, average transmission power, which ranges from several tens of W to several hundreds of W, is required as the output of the linearized power amplifier 1007 to allow one base station to support several tens to several hundreds of subscribers.

Further, since the phase/amplitude modulation system is adopted in the digital mobile communication system which is on the mainstream to implement a variety of communication services, high linearity is required of the linearized power amplifier 1007. In order to make up for non-linearity of a semiconductor device for implementing the linearized power amplifier, the efficiency thereof is generally low and values ranging from several hundreds of W to a few KW as saturation power are required of the linearized power amplifier. Therefore, an improvement in the efficiency of the linearized power amplifier brings about a great effect at reducing power consumption of the base station.

Figure 17A:
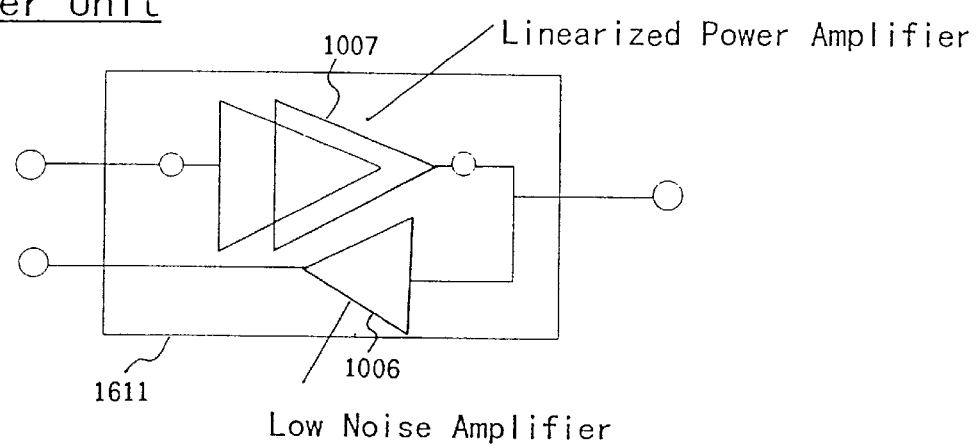
FIG. 17A is a diagram depicting a transmitting/receiving amplifier of a cellular base station.
Figure 17B:
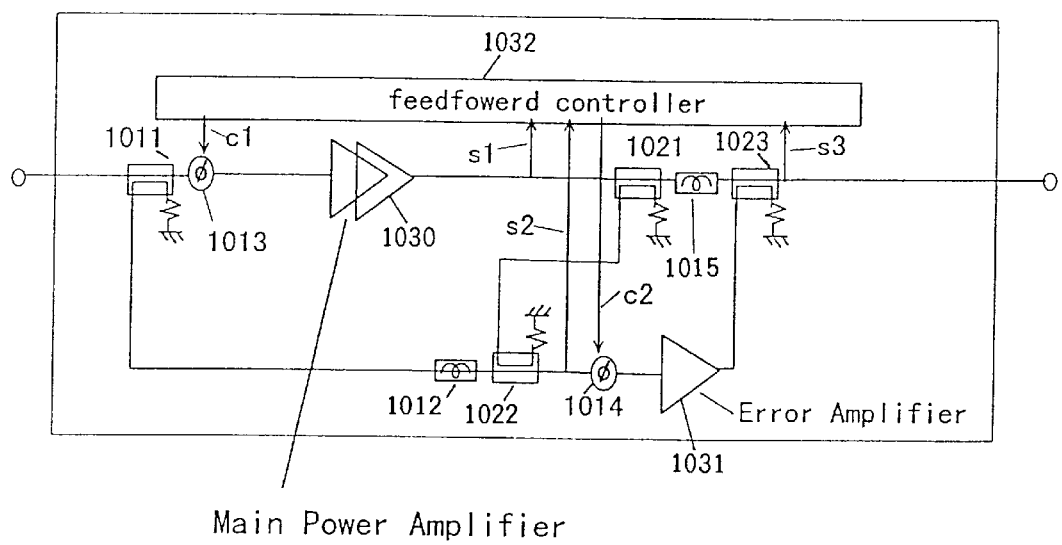
FIG. 17B is a block diagram showing a linearized power amplifier for the cellular base station.
Figure 18:
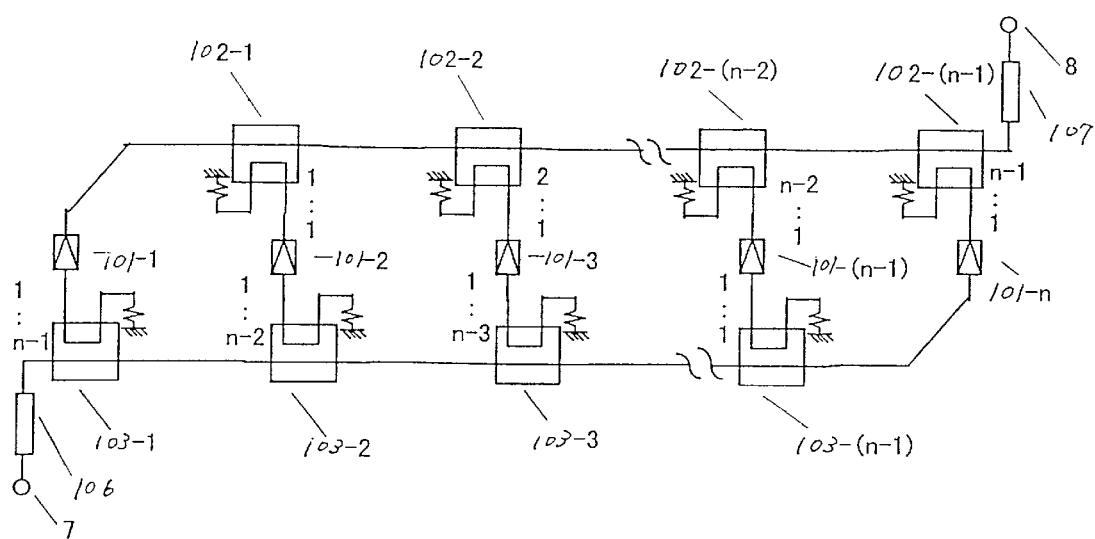
FIG. 18 is a block diagram illustrating a configuration of a conventional distribution power combiner.
Figure 19A:
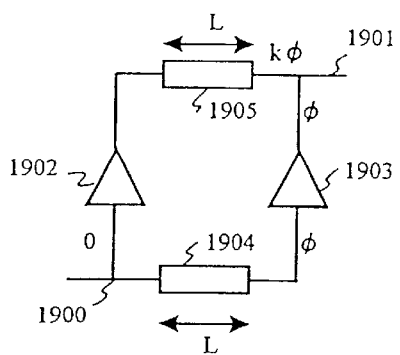
FIG. 19A is a first diagram for describing the principle of the present invention.
Figure 19B:
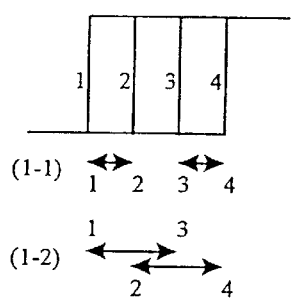
FIG. 19B is a second diagram for describing the principle of the present invention.
Figure 19B:
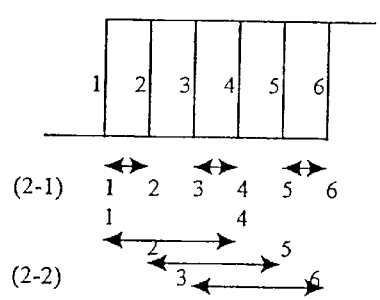
Figure 19B:
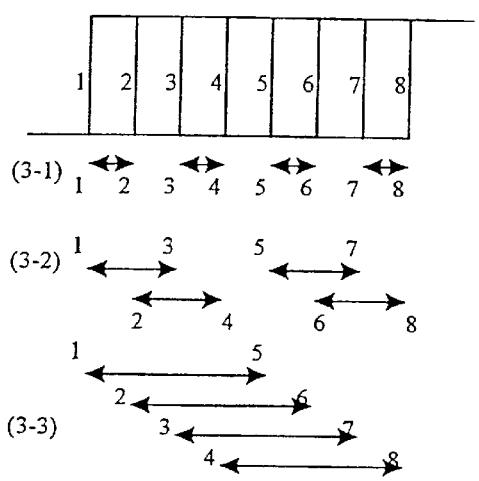
Figure 19B:
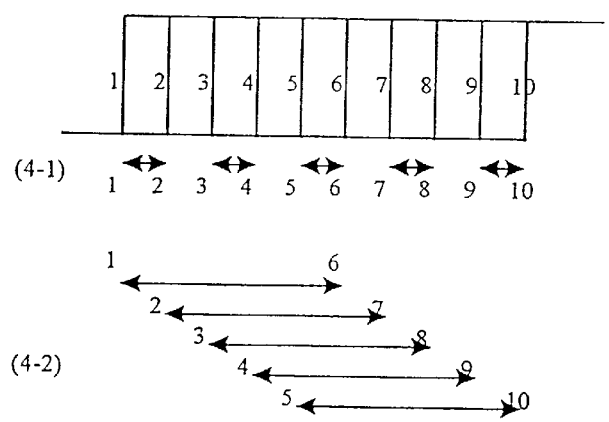

The amplification of transmitting power is performed by a linearized power amplifier 1007 in a transmitting/receiving amplifier shown in FIG. 17A. A received signal is amplified by a low noise amplifier 1006. FIG. 17B shows an example of a configuration of a feed forward type power amplifier as one typical linearized power amplifier 1007. A main signal amplified by a main power amplifier 1030 is divided by a branch circuit 1021 and combined with the pre-amplification main signal by a combiner 1022. Thus, an error signal (distortion signal) caused by the amplification of the main signal is extracted (by an error signal detection circuit). The extracted error signal is amplified by an error amplifier 1031. The amplified error signal is combined with the amplified main signal by the combiner 1023, whereby distortion is eliminated from the amplified main signal (by a distortion elimination circuit). A feedforward controller 1032 monitors power and controls variable phasers 1013 and 1014 to optimize the elimination of distortion.

Since the linearity of the current semiconductor power amplifier using the semiconductor is generally insufficient, a large-output main power amplifier 1030 is built in a linearized power amplifier to thereby ensure the linearity of power amplification required of the system. A semiconductor device used for the power amplifier is normally low in one-device outputtable power and provides a saturation output which ranges from about 10 W to 200 W at a 2 GHz band under the present technical level, for example. Thus, the main power amplifier 1030 makes use of a plurality of amplifiers each comprised of a semiconductor device and merges or combines their outputs into one.

Figure 1:
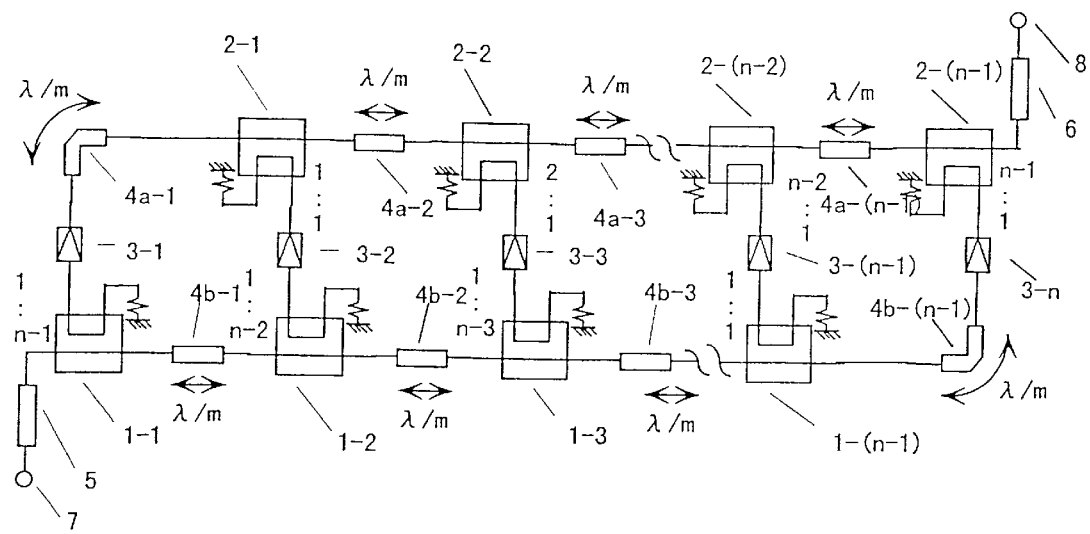
FIG. 1 is a block diagram showing a first configuration example of a travelling wave power combiner (first embodiment) according to the present invention.

FIG. 1 shows a first configuration example of a travelling wave power combiner used as the main power amplifier 1030. A combining number will be defined as n. Directional couplers are applied to branch circuits 1 and combiners 2, and transmission lines 4a and 4b are provided. An input terminal of a branch circuit 1-1 is coupled to an input terminal 7 through an input transmission line 5. A first output terminal of the branch circuit 1-1 is electrically connected to a power amplifier 3-1, whereas a second output terminal thereof is electrically coupled to an input terminal of a branch circuit 1-2 through a coupling transmission line 4b-1. The output of the power amplifier 3-1 is coupled to a first input terminal of a combiner 2-1 through the coupling transmission line 4a-1. The output of a power amplifier 3-2 is coupled to a second input terminal of the combiner 2-1 and an output terminal thereof is coupled to a first input terminal of a combiner 2-2 through a coupling transmission line 4a-2.

Similarly, a second output terminal of a branch circuit 1-(i−1) is coupled to an input terminal of a branch circuit 1-i (2≦i≦n−2) through a coupling transmission line 4b-(i−1). A first output terminal of the branch circuit 1-i is electrically connected to a power amplifier 3-i and a second output terminal thereof is electrically connected to an input terminal of a branch circuit 1-(i+1) through a coupling transmission line 4b-i.

Further, an output terminal of a combiner 2-(i−1) is coupled to a first input terminal of a combiner 2-i (2≦i≦n−2) through a coupling transmission line 4a-i, whereas the output of a power amplifier 3-(i+1) is coupled to a second input terminal thereof. An output terminal thereof is coupled to a first input terminal of a combiner 2-(i+1) through a coupling transmission line 4a-(i+1).

A branch circuit 1-(n−1) and a combiner 2-(n−1) have connection relations similar to the above. However, a second output terminal of the branch circuit 1-(n−1) is coupled to a power amplifier 3-n through a coupling transmission line 4b-(n−1). Further, an output terminal of the combiner 2-(n−2) is coupled to a first input terminal of the combiner 2-(n−1) through a coupling transmission line 4a-(n−1), whereas a second input terminal thereof is coupled to the output of the power amplifier 3-n. The output of the combiner 2-(n−1) is coupled to an output terminal 8 through an output transmission line 6. Incidentally, branching ratios (combining ratios) of branch circuits (combiners) are shown in the drawing.

When the directional couplers are used for the branch circuits 1 and the combiners 2, isolation between the respective power amplifiers 3 can be kept high. In the directional coupler, the amount of coupling thereof is determined according to an interval of a parallel conductor which constitutes a coupler, and each coupling transmission line 4, input transmission line 5 and output transmission line 6 can be set equal in impedance. When these lines are formed of a micro strip line, the width thereof can be kept constant, so that the area of the power combiner can be restrained.

In the present invention, an electric length L of the coupling transmission line 4 will be defined based on the above-described principle. An electric length between power amplifiers utilized in combination in the travelling wave power combiner may be set so as to take $\lambda/(2i)$ (where $\lambda$=wavelength of fundamental wave and i=positive integer) and transmission lines between the adjacent power amplifiers may be set equal in length to each other. At this time, the power of an (i+1)th harmonic outputted from a power amplifier separated by $\lambda/(2i)$ is returned to the power amplifier again, where it is converted to a fundamental wave component. It is thus possible to improve the efficiency of combining of outputs from the power amplifiers.

Figure 2:
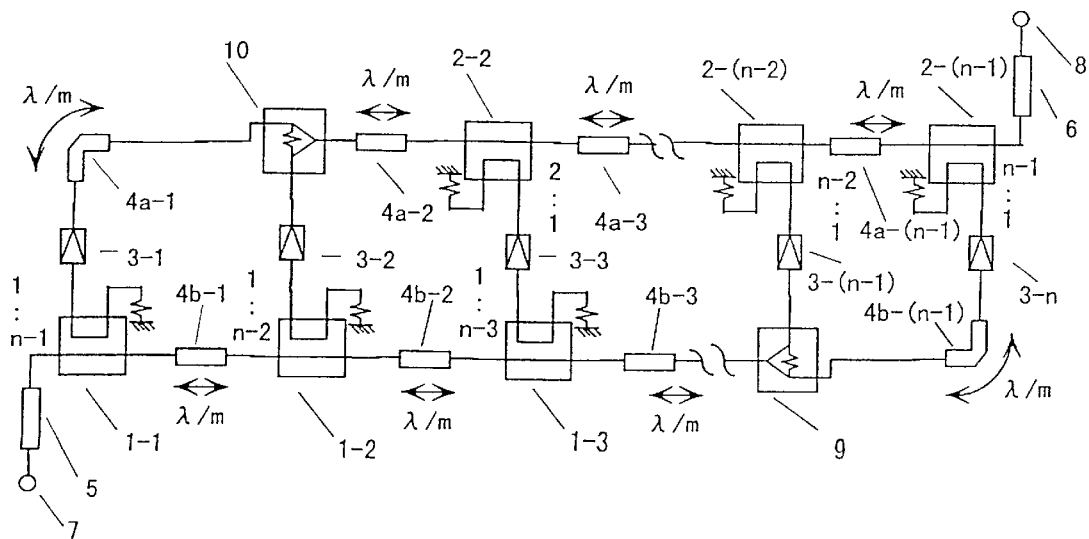
FIG. 2 is a block diagram illustrating a second configuration example of the travelling wave power combiner (first embodiment)

FIG. 2 is a block diagram showing a second configuration example of the travelling wave power combiner (first embodiment). The travelling wave power combiner has a feature in that the branch circuit 1-(n−1) and the combiner 2-1 shown in the configuration example of FIG. 1 are respectively replaced with a wilkinson-type power branch circuit 9 and a wilkinson-type power combiner 10. A branching ratio and combining ratio of a branch circuit 1-n and a combiner 2-1 are 1:1 respectively. When the branch circuit 1-n and the combiner 2-1 are respectively constructed of a directional coupler having a monolayered structure using electromagnetic coupling, the required amount of electromagnetic coupling increases and the fabrication of its construction falls into difficulties. The wilkinson-type power branch circuit (combiner) having the branching ratio (combining ratio) of 1:1 provides the effects of being capable of being easily manufactured by a planar circuit having a monolayered structure and reducing its cost.

Figure 3:
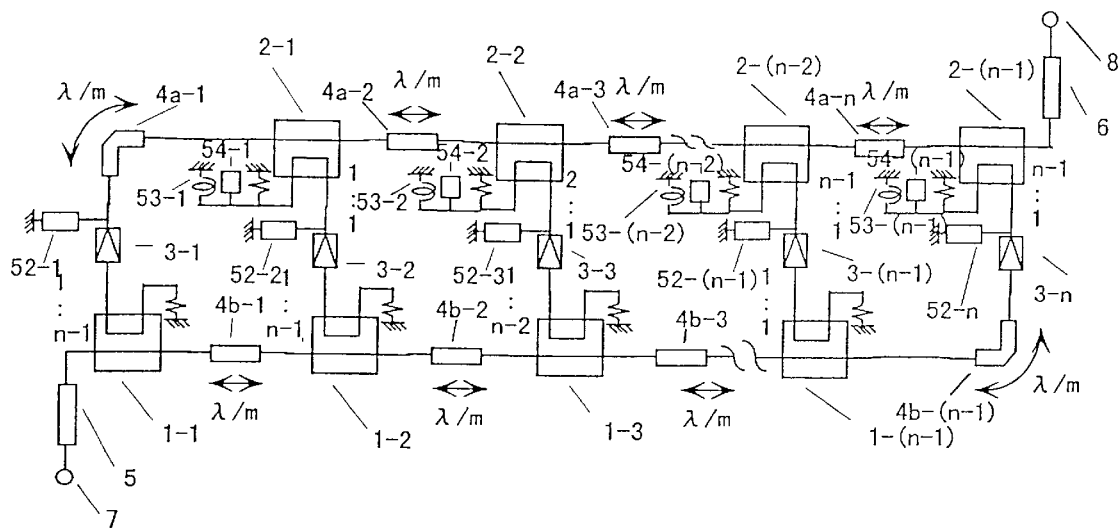
FIG. 3 is a block diagram depicting a third configuration example of the travelling wave power combiner (first embodiment)

FIG. 3 is a block diagram showing a third configuration example of the travelling wave power combiner (first embodiment). A first feature of the present configurational example resides in that short stubs 52 are connected to their corresponding output terminals of power amplifiers 3. Described specifically, combiners 2 are implemented by means of quarter directional couplers and each short stub 52 has an electric length corresponding to a wavelength equal to one-fourth of a fundamental wave (f). Since the output terminals of the power amplifiers are short-circuited as to even-order harmonics (2f, 4f . . . ) owing to the provision of such short stubs, even-order harmonic power is fed back to the power amplifiers and some thereof is converted to a fundamental wave component. Therefore, the efficiency of the travelling wave power combiner increases.

It is desirable that when such a construction is utilized, the components of the even-order harmonics are canceled out each other by the short stubs and the components of odd-order harmonics are canceled out each other according to the selection of transmission line lengths. A third harmonic and a 5th harmonic can be canceled out by taking m=⅛ in the case of the 8-combining, for example. Since the distortion of power outputted from each combiner is improved where the travelling wave power combiner is constructed so as to cancel out the odd-order harmonics each other, the operating point can be increased and hence the efficiency of the combiner can be improved.

A second feature resides in that open stubs 54 each having an electric length corresponding to a wavelength equal to one-twelfth the fundamental wave and resonant inductors 53 whose one ends are grounded, are coupled in parallel to matching terminators of the combiners 2. The value of inductance of the resonant inductor 53 is selected so as to resonate in parallel with the open stub 54 at a frequency of the fundamental wave. For example, the inductance value thereof results in about 6 nH at a fundamental wave 2 GHz (frequency employed in the cellular system). Thus, this can be implemented with a practically sufficient Q value. Since, at this time, the matching terminators of the ¼-wavelength directional couplers (combiners 2) are shorted as to the third harmonic (3f), third harmonic power is fed back to the power amplifiers without being consumed through the resistance of the matching terminator of each combiner 2 and some thereof is converted to a fundamental wave component. Therefore, the efficiency of the travelling wave power combiner can be kept high even when the respective power amplifiers are out of balance.

Figure 4:
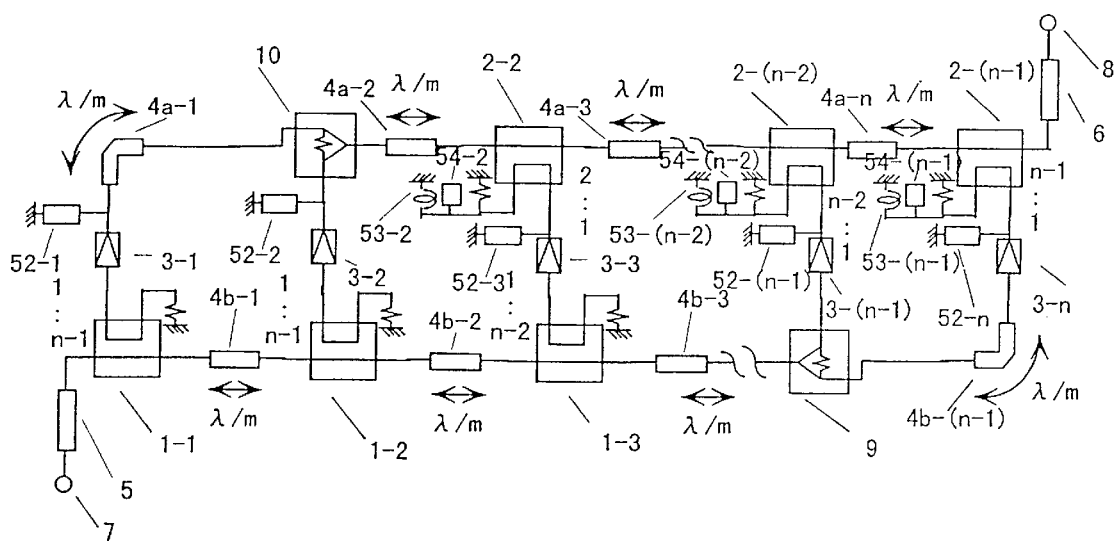
FIG. 4 is a block diagram showing a fourth configuration example of the travelling wave power combiner (first embodiment)

FIG. 4 is a block diagram showing a fourth configuration example of the travelling wave power combiner (first embodiment). The branch circuit 1-(n−1) and combiner 2-1 shown in the configuration example of FIG. 3 are replaced with a wilkinson-type power branch circuit 9 and a wilkinson-type power combiner 10 respectively.

Figure 5:
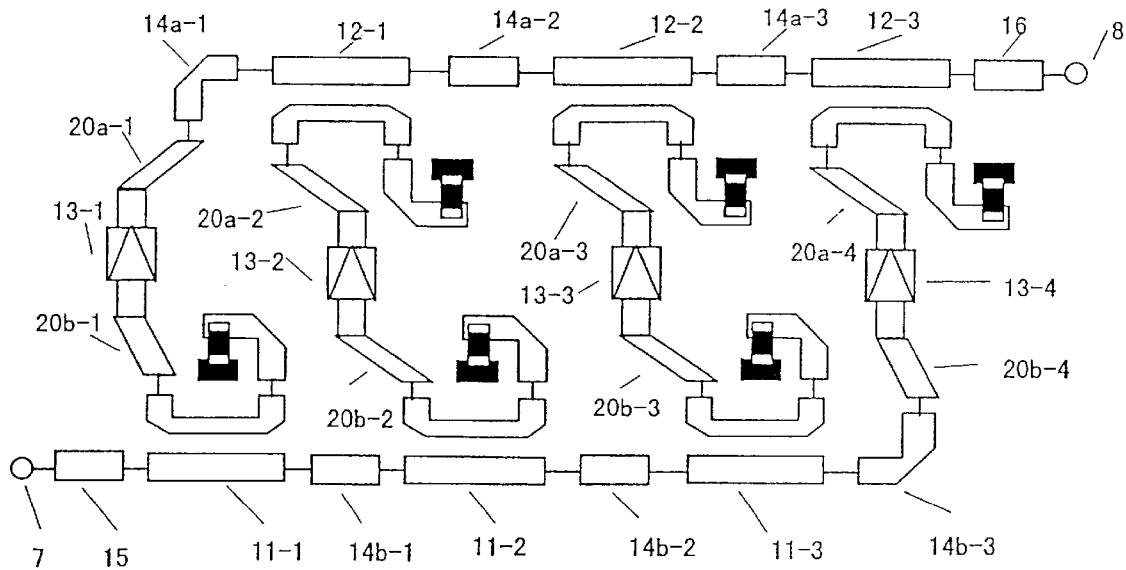
FIG. 5 is a planar circuit pattern diagram corresponding to the first configuration example of the travelling wave power combiner (first embodiment)

FIG. 5 is a pattern diagram corresponding to the configuration example shown in FIG. 1 implemented by planar circuits. The drawing shows a planar pattern of the travelling wave power combiner at n=4. An input terminal of a branching microstrip directional coupler 11-1 (branch circuit 1) is coupled to an input terminal 7 via an input microstrip line 15 (input transmission line 5). A first output terminal of the branching microstrip directional coupler 11-1 is coupled to a surface mount type power amplifier 13-1 (power amplifier 3), whereas a second output terminal thereof is coupled to a first input terminal of a branching microstrip directional coupler 11-2 through a coupling microstrip line 14b-1 (coupling transmission line 4b). Incidentally, an input matching microstrip line 20b-1 and an output matching microstrip line 20a-1 are respectively connected to input/output terminals of the surface mount type power amplifier 13-1. The output of the surface mount type amplifier 13-1 is coupled to a first input of a combining microstrip directional coupler 13-1 (combiner 2) through a coupling microstrip line 14a-1 (coupling transmission line 4a).

Further, an output terminal of a combining microstrip directional coupler 12-2 is coupled to a first input terminal of a combining microstrip directional coupler 12-3 through a coupling transmission line 14a-3, and a surface mount type power amplifier 13-4 is coupled to a second output terminal thereof. An output terminal of the combining microstrip directional coupler 12-3 is coupled to an output terminal 8 through an output microstrip line 16 (output transmission line 6). Incidentally, those shown in the parentheses indicate their corresponding circuit configurations of FIG. 1. Further, each of the branching microstrip directional coupler 11 and combining microstrip directional coupler 12 makes use of a ¼-wavelength microstrip directional coupler, for example.

The following characteristics are included in the planar pattern shown in FIG. 5. The first is that the longitudinally-extending central axes of linear gaps between microstrip couplers each constituting the branching microstrip directional coupler are placed linearly with respect to the respective branching microstrip directional couplers 11-1 through 11-3. The combining microstrip directional coupler 12 is also similar to the above. The directions of equivalent magnetic current sources developed in the linear gaps are radiating directions null each other at both ends of the microstrip couplers each constituting the microstrip directional coupler. Therefore, electromagnetic coupling between the branching (combining) microstrip directional couplers 11 (12) is restrained so that the operation of the travelling wave power combiner is stabilized.

The second is that the linear gap between the adjacent branching microstrip directional couplers 11 and the linear gap between the adjacent combining microstrip directional couplers 12 are not opposed to each other or the opposite ones are provided so as to be as small as possible. In the example shown in FIG. 5, the linear gaps between the branching microstrip directional couplers 11-1 through 11-3 are respectively provided so as to be opposed to the coupling microstrip lines 14a-1 through 14a-3, whereas the linear gaps between the combining microstrip directional couplers 12-1 through 12-3 are respectively provided so as to be opposite to the coupling microstrip lines 14b-1 through 14b-3. If the linear gap between the adjacent branching microstrip directional couplers 11 and the linear gap between the adjacent combining microstrip directional couplers 12 are placed in opposing relationship, then each microstrip coupler of the branching microstrip directional coupler 11 and each microstrip coupler of the combining microstrip directional coupler 12 are electromagnetically coupled therebetween. Thus, this might exert a bad influence on the circuit operation. The operation of the travelling wave power combiner is stabilized by placing the equivalent magnetic current sources developed in the linear gaps between the branching microstrip directional couplers and the equivalent magnetic current sources developed in the linear gaps between the combining microstrip couplers so as not to be directly opposed to one another.

Figure 6:
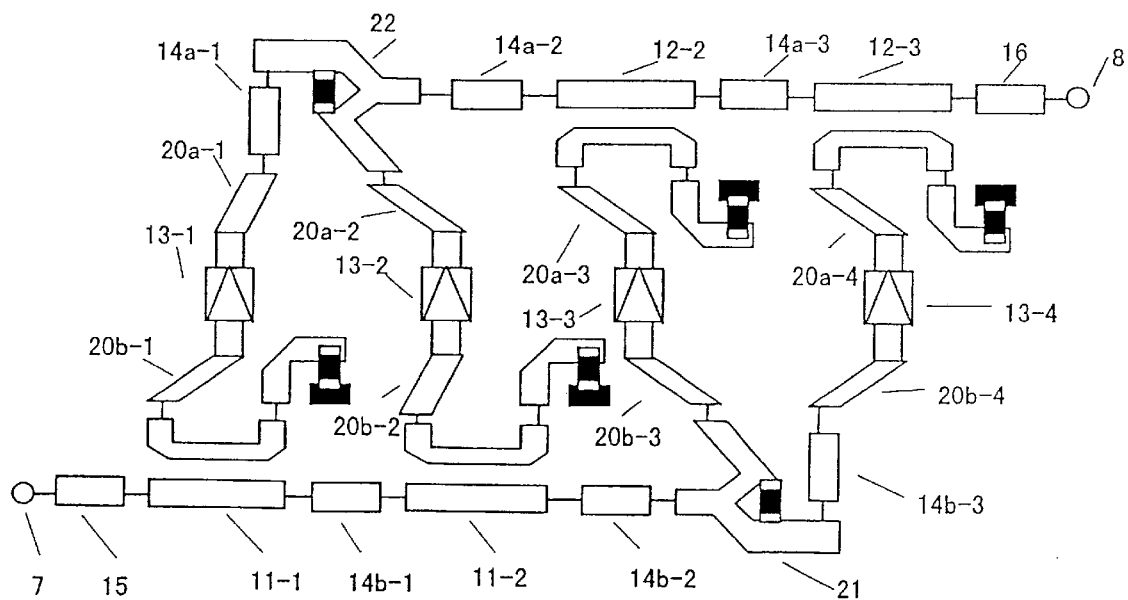
FIG. 6 is a planar circuit pattern diagram corresponding to the second configuration example of the travelling wave power combiner (first embodiment)

FIG. 6 is a pattern diagram corresponding to the configuration example shown in FIG. 2 implemented by planar circuits. The drawing shows a flat or planar pattern of the travelling wave power combiner at n=4. If compared with the planar pattern shown in FIG. 5, then the branching microstrip directional coupler 11-3 is replaced by a planar wilkinson-type two branch divider or circuit 21 (wilkinson-type power branch circuit 9) and the combining microstrip directional coupler 12-1 is replaced with a planar wilkinson-type two branch divider or circuit 22 (wilkinson-type power branch circuit 10), respectively. As described in regard to FIG. 2, the accuracy of fabrication of the planar circuit pattern can be lessened and the manufacturing cost can be reduced. Incidentally, those shown in the parentheses indicate their corresponding circuit configurations of FIG. 2.

Figure 7:
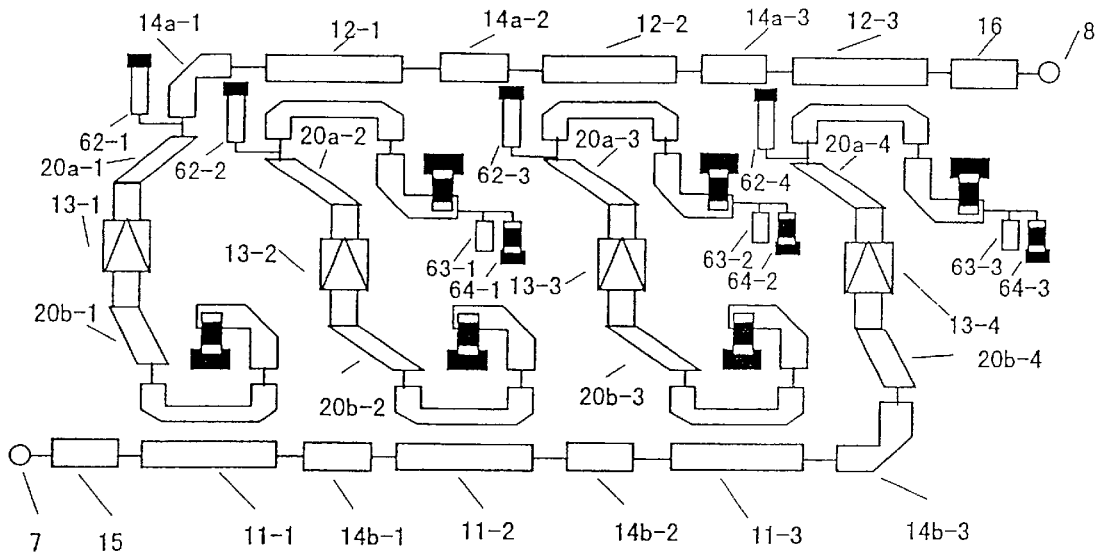
FIG. 7 is a planar circuit pattern diagram corresponding to the third configuration example of the travelling wave power combiner (first embodiment)

FIG. 7 is a pattern diagram corresponding to the configuration example shown in FIG. 3 implemented by planar circuits. The drawing shows a planar pattern of the travelling wave power combiner at n=4. Short microstrip stubs 62 (short stubs 52) each having an electric length corresponding to a wavelength equal to one-fourth the fundamental wave are respectively connected to output terminals of respective surface mount type power amplifiers 13. Open microstrip stubs 63 (open stubs 54) each having an electric length corresponding to a wavelength equal to one-twelfth the fundamental wave, and resonant chip inductors 64 (resonant inductors 53) whose one ends are grounded, are respectively connected in parallel with matching terminators of respective combining microstrip directional couplers 12. Incidentally, those shown in the parentheses indicate their corresponding circuit configurations of FIG. 3.

Figure 8:
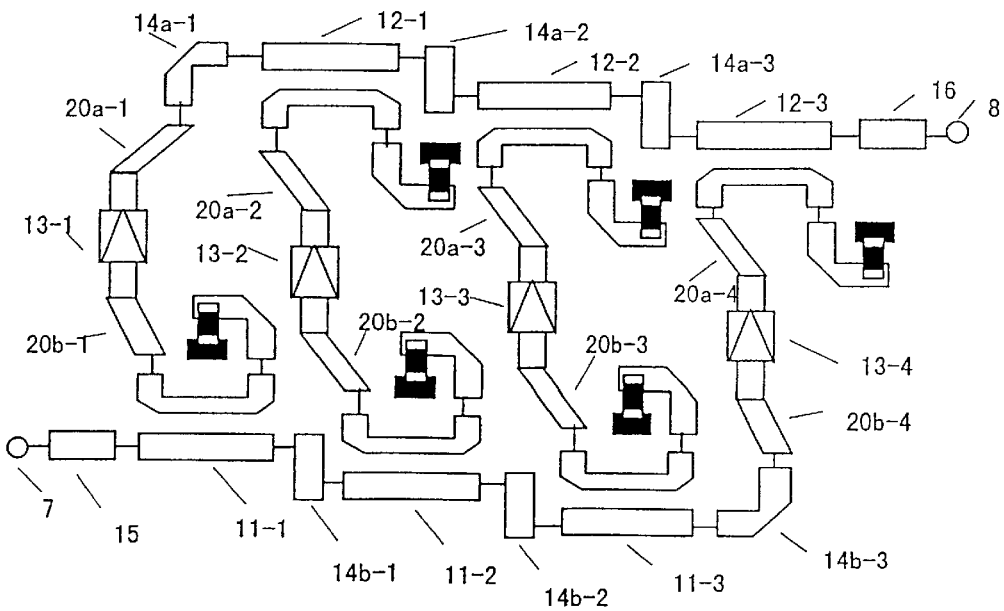
FIG. 8 is a planar circuit pattern diagram corresponding to the first configuration example of the travelling wave power combiner (first embodiment)

FIG. 8 shows a first modification of the planar pattern shown in FIG. 5. Longitudinal directions of respective coupling microstrip lines 14a (14b) are placed so as to take directions substantially orthogonal to longitudinal directions of combining microstrip directional couplers 12 (respective branching microstrip lines 11). Owing to such placement, the interval between an input terminal 7 and an output terminal 8 of the travelling wave power combiner can be shortened and the area thereof can be reduced.

A combining microstrip directional coupler 12-1 and a branching microstrip directional coupler 11-3 may be replaced by a planar wilkinson-type double combiner and a planar wilkinson-type two branch dividers or circuits, respectively (corresponding to the configuration example shown in FIG. 2). The planar pattern shown in FIG. 8 may of course be applied even to the configuration examples shown in FIGS. 3 and 4.

Figure 9:
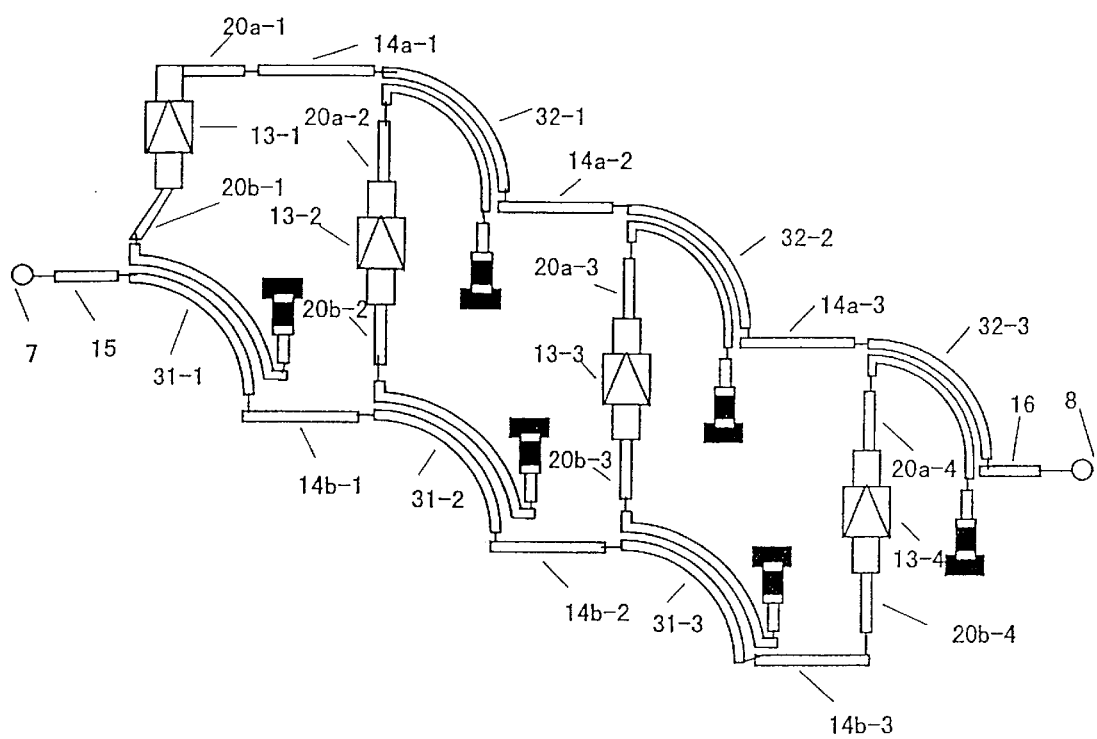
FIG. 9 is a planar circuit pattern diagram corresponding to the first configuration example of the travelling wave power combiner (first embodiment)

FIG. 9 shows a second modification of the planar pattern shown in FIG. 5. The branching microstrip directional couplers 11 and the combining microstrip directional couplers 12 are replaced with ¼-arcuate branching wavelength microstrip directional couplers 31 and ¼-arcuate combining microstrip directional couplers 32 respectively. In the structure shown in FIG. 9, the respective ¼-arcuate branching microstrip directional couplers (respective ¼-arcuate combining microstrip directional couplers) are placed in a parallel translation relationship to one another.

The travelling wave power combiner is stably operated because equivalent magnetic current sources developed in linear gaps between the ¼-arcuate branching microstrip directional couplers and equivalent magnetic current sources developed in linear gaps between the ¼-arcuate combining microstrip directional couplers are not directly opposed to one another due to the formation of the linear gaps between the microstrip directional couplers in arcuate form. A transverse size extending from the input terminal 7 to the output terminal 8 is also shortened to substantially two-third that employed in the travelling wave power combiner shown in FIG. 5.

Figure 10:
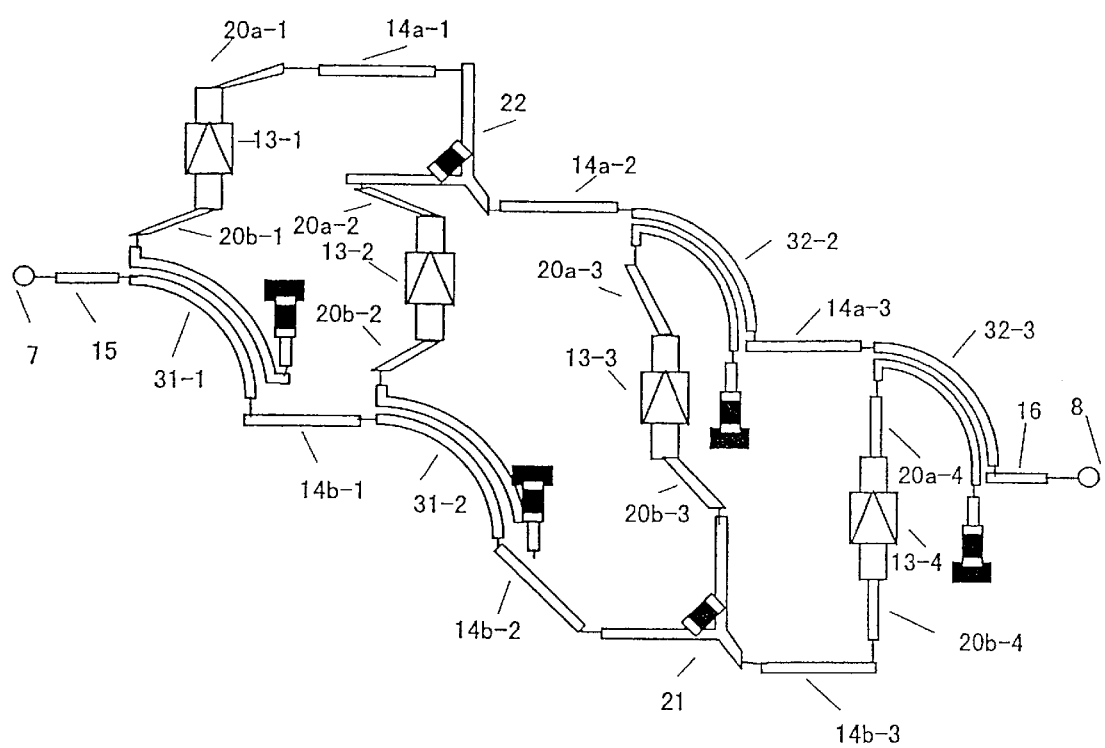
FIG. 10 is a planar circuit pattern diagram corresponding to the second configuration example of the travelling wave power combiner (first embodiment)

As shown in FIG. 10, a ¼-arcuate combining microstrip directional coupler 32-1 and a ¼-arcuate branching microstrip directional coupler 31-3 may be replaced by a planar wilkinson-type double combiner 22 and a planar wilkinson-type two branch divider or circuit 21 respectively in the planar pattern shown in FIG. 9 (corresponding to the configuration example shown in FIG. 2). The planar patterns shown in FIGS. 9 and 10 can be of course applied even to the configuration examples shown in FIGS. 3 and 4.

Figure 11:
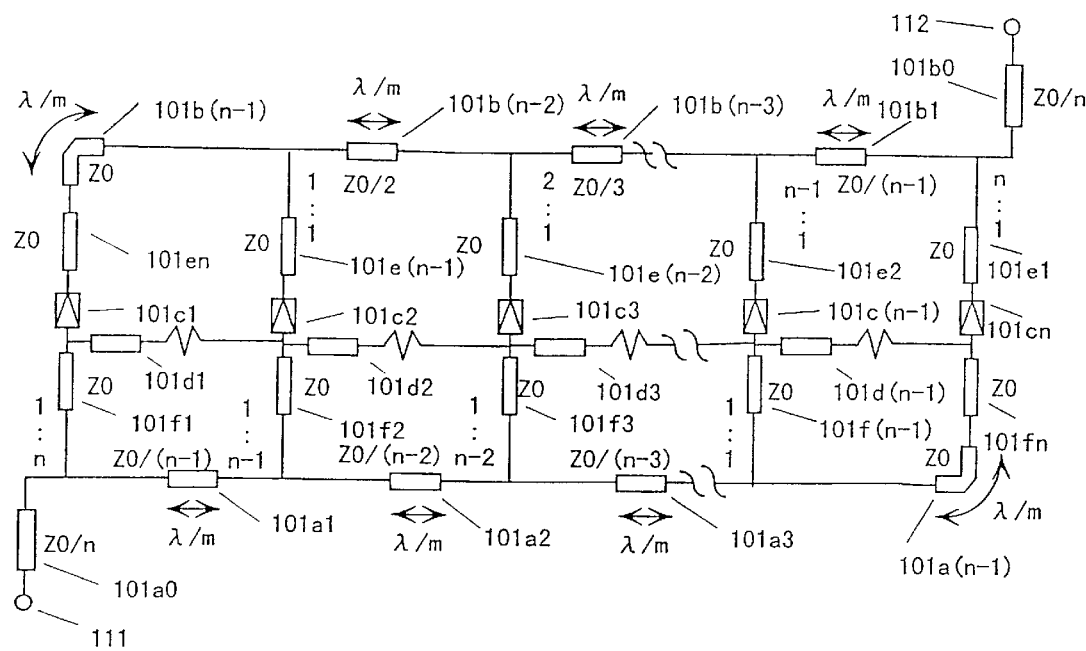
FIG. 11 is a block diagram showing a first configuration example of a travelling wave power combiner (second embodiment)

FIG. 11 shows a first configuration example of a second embodiment of a travelling wave power combiner used as a main power amplifier 1030. A combining number will be defined as n. In the second embodiment, pieces of power are distributed or combined into one according to an impedance ratio between lines. A signal inputted to an input terminal 111 is distributed by means of a first branch circuit (corresponding to an input matching transmission line 101f1 and a branching transmission line 101a1) through an input transmission line 101a0. A first output (corresponding to the output of the input matching transmission line 101f) of the first branch circuit is inputted to a first power amplifier 101c1, whereas a second output (corresponding to the output of the branching transmission line 101a) is inputted to a second branch circuit (corresponding to 101f2 and 101a2). Power branching/combining ratios are respectively designated at points where the input matching transmission lines 101f and the branching transmission lines 101a are connected to one another. If power inputted to the input transmission line 101a1 from the input terminal 111 is defined as n, for example, it is then necessary to distribute power inputted to the first input matching transmission line 101f1 and power inputted to the first branching transmission line 101a1 to 1:(n−1). For the purpose of coping with it, the characteristic impedance of the input transmission line 101a0 and the characteristic impedance of the first branching transmission line 110a1 may be defined as Z0/n and Z0/(n−1) respectively if the characteristic impedance of the input matching transmission line 101f1 is set as Z0. The impedances of other input matching transmission lines and branching transmission lines are determined in the same relationship to the above.

The output of the first power amplifier 101c1 results in a first input (corresponding to the input of a combining transmission line 101b) of a n−1th combiner (corresponding to a combining transmission line 101b(n−1) and an output matching transmission line 101e(n−1)) through a line 101en. Incidentally, a second input (corresponding to the input of an output matching transmission line 101e) results in the output of a second power amplifier 101c2.

Similarly, a second output of an i−1th branch circuit is inputted to an ith branch circuit ($2 \leq i \leq n-2$). A first output (101f) thereof is inputted to a power amplifier 101ci. A second output (101a) is inputted to an i+1th branch circuit. The output of an n−(i−1)the combiner is inputted as a first input (101b side) of an n−ith combiner ($2 \leq i \leq n-2$), and the output of an i+1th power amplifier is inputted as a second input (101e side).

An n−1th branch circuit (101f(n−1), 101a(n−1)) and a first combiner (101b1 and 101e1) have connection relationships similar to the above. A second output (101a side) of the n−1th branch circuit is inputted to an nth power amplifier 101cn through a line 101fn. The output of the first combiner is coupled to an output terminal 112 through an output transmission line 101b0. Branching ratios or combining ratios and impedance ratios between the respective lines are represented as shown in the drawing.

As a first feature, electric lengths of the transmission lines 101a and 101b are determined in a manner similar to the first embodiment. It is thus possible to improve the output combining efficiency of each power amplifier.

As a second feature, the input side of the power amplifier 101ci and the input side of a power amplifier 101ci+1 ($1 \leq i \leq n-1$) are respectively connected to one another by a transmission line 101di for isolation, which includes a series resistor. Here, the transmission line 101d for isolation has an electric length equal to that of each of the transmission lines 101a and 101b. Owing to such a structure, even if the inputs to the power amplifiers are unbalanced, such unbalance can be accommodated by the series resistors of the transmission lines for isolation, whereby the isolation between the respective power amplifiers can be kept high.

Figure 12:
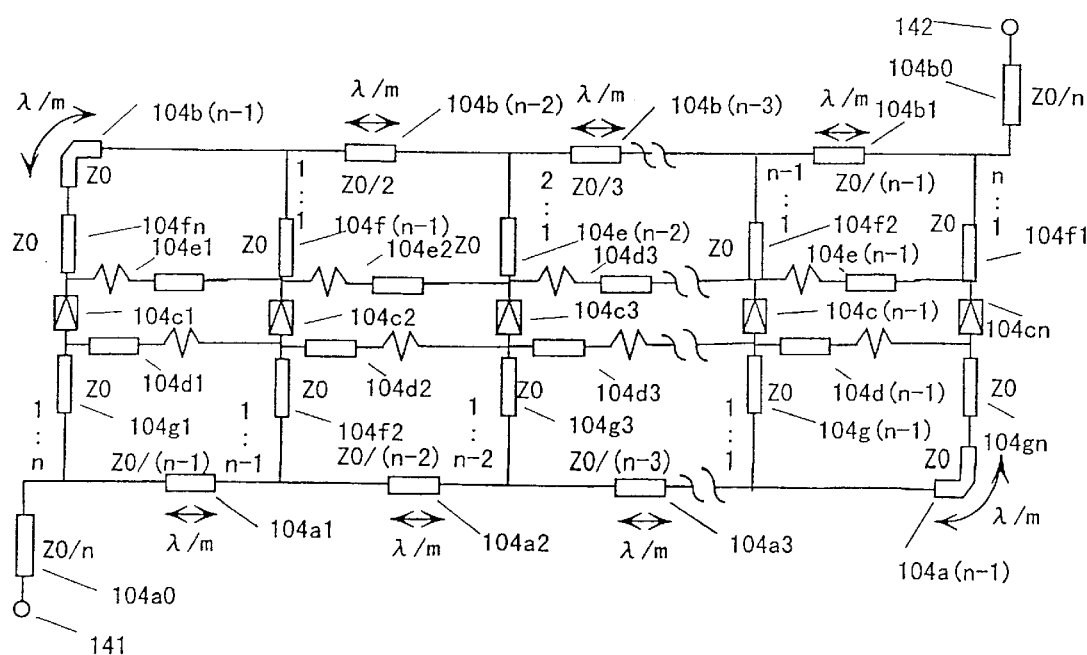
FIG. 12 is a block diagram illustrating a second configuration example of the travelling wave power combiner (second embodiment)

FIG. 12 is a block diagram showing a second configuration example of the travelling wave power combiner (second embodiment). In addition to the configuration shown in FIG. 11, the output side of the power amplifier 101ci and the power amplifier 101ci+1 ($1 \leq i \leq n-1$) are connected to each other by the transmission line 101di for isolation, which includes the series resistor. Since the isolation between the outputs of the power amplifiers is improved in such a construction, it is possible to lessen the influence of characteristic deviations or the like developed between the respective power amplifiers 101c as compared with the configuration example shown in FIG. 11.

Figure 13:
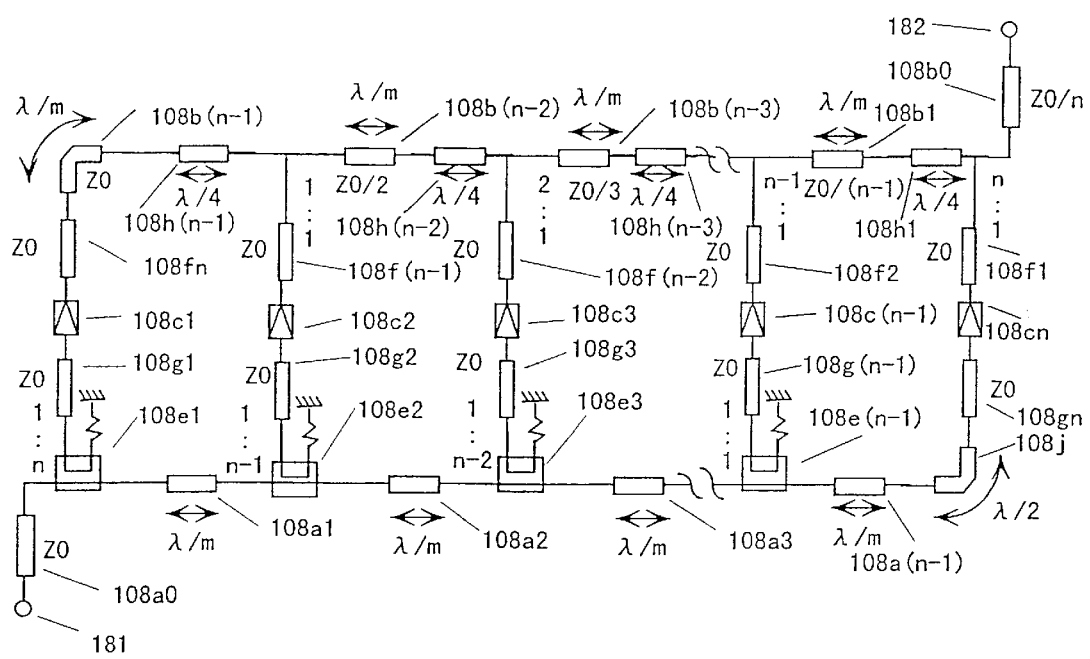
FIG. 13 is a block diagram depicting a third configuration example of the travelling wave power combiner (second embodiment)

FIG. 13 is a block diagram showing a third configuration example of the travelling wave power combiner (second embodiment). In the present embodiment as distinct from the embodiment shown in FIG. 11, directional couplers are adopted as branch circuits. It is desirable that since a pre-amplification displacement or deviation is amplified by a power amplifier and exerts a great influence on the circuit operation, the isolation is rendered high on the input side.

Directional couplers 108e1 through 108e(n−1) are respectively inserted in front of coupling transmission lines 108a1 through 108a(n−1) on the input side, which connect between respective power amplifiers. Power is distributed to the respective power amplifiers by these directional couplers. As to the degree of coupling of each directional coupler, the degree of coupling of the first directional coupler 108e1 is 1/n, that of the second directional coupler 108e2 is 1/(n−1), and that of the n−1th directional coupler 108e(n−1) is 1/2. In the example illustrated in the drawing, ¼-wavelength directional couplers are used as these directional couplers. In order to compensate for phase differences developed due to the use of the ¼-wavelength directional couplers, phase-compensating transmission lines 108h1 through 108h(n−1) each having an electric length corresponding to a substantially ¼ wavelength are provided on the output side. Further, an input-side phase compensating transmission line 108j having an electric length corresponding to an approximate ½ wavelength is provided posterior to the coupling transmission line 108a(n−1) on the input side. A wilkinson-type power branch circuit may be used as the n−1th directional coupler.

Owing to such a construction, the isolation on the input side of each power amplifier can be made high and abnormal oscillations or the like developed due to the influence of input impedance between the power amplifiers can be lessened. Further, the impedance of each coupling transmission line 108a on the input side can be kept constant. It is therefore possible to restrain an increase in circuit scale.

Figure 14:
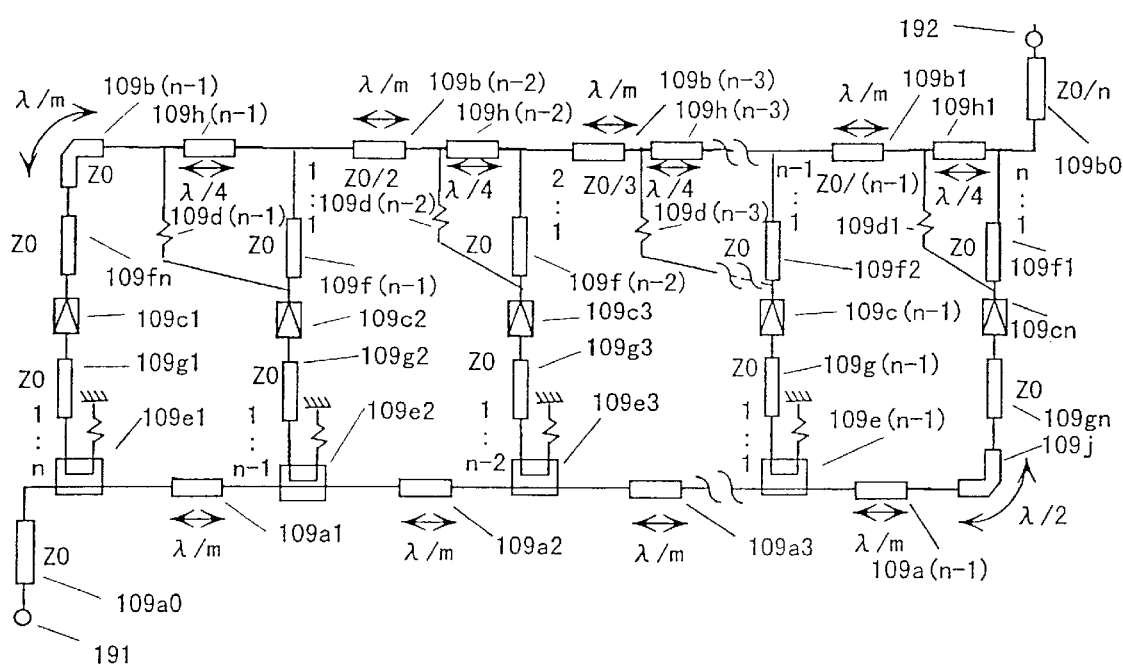
FIG. 14 is a block diagram showing a fourth configuration example of the travelling wave power combiner (second embodiment)

FIG. 14 is a block diagram showing a fourth configuration example of the travelling wave power combiner (second embodiment). The present embodiment is different from the embodiment shown in FIG. 13 in that line lengths of transmission lines 109f1 through 109fn provided on the output sides of respective power amplifiers are respectively set approximately to a ¼ wavelength and a resistor 109d(i−1) for isolation is provided between an output terminal of an ith power amplifier 109ci ($2 \leq i \leq n$) and the output side of an i−1th coupling transmission line 109b(i−1). In a manner similar to the configuration shown in FIG. 12 owing to such a configuration, each power amplifier can be rendered high in isolation on the output side thereof and the influence of characteristic deviations developed between the power amplifiers can be lessened.

Figure 15:
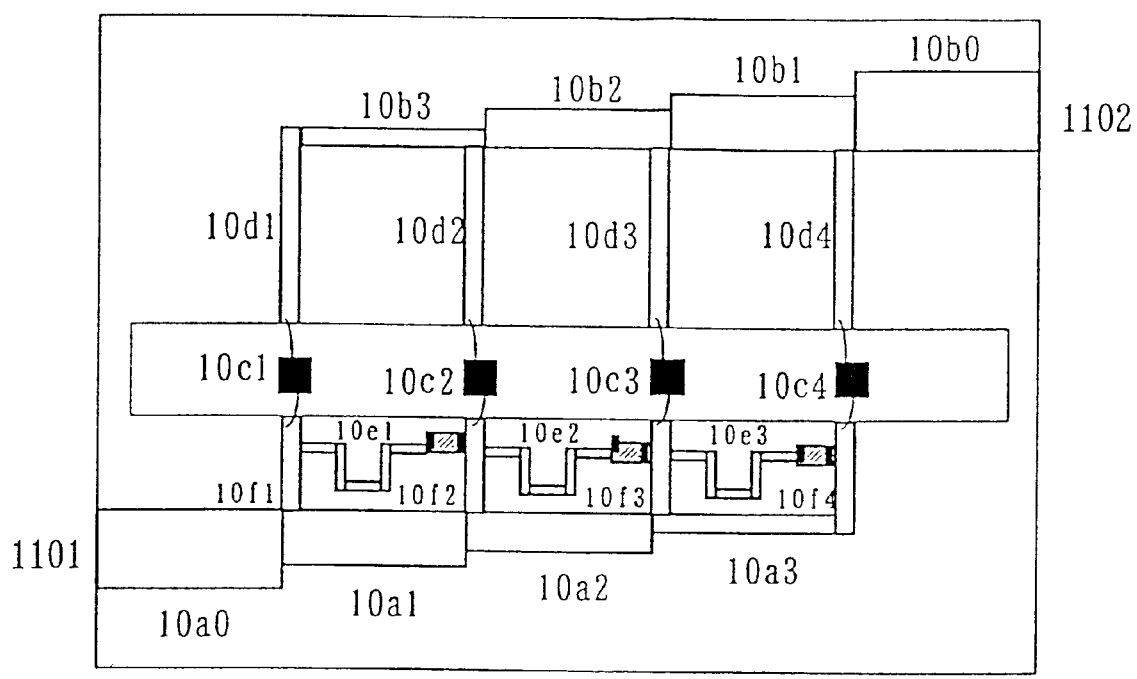
FIG. 15 is a planar circuit pattern diagram corresponding to the first configuration example of the travelling wave power combiner (second embodiment)

FIG. 15 is a planar pattern showing the configuration of the travelling wave power combiner shown in FIG. 11, which is implemented by a planar circuit having a mono-layered structure. The drawing shows an example of n=4. A signal is inputted to an input terminal 1101 so as to be by-power distributed to an input-side line 10f1 of a first transistor chip (power amplifier) 10c1 and a coupling transmission line 10a1 through an input microstrip line 10a0. The output side also functions in a manner similar to the above. That is, the sum of signals amplified by the first to third transistor chips passes through a coupling transmission line 10b1, followed by combining with a signal outputted from an output-side line 10d4 and amplified by a fourth transistor chip 10c4. Thereafter, the combined signal is outputted from an output terminal 1102 through an output microstrip line 10b0. Here, lines 10e1 through 10e3 for isolation, which include isolation resistors respectively, are provided between the input-side lines 10f of the respective transistor chips.

According to the present invention, since harmonic components can be canceled out by a power combiner, each power amplifier can be improved in power efficiency.

It is further understood by those skilled in the art that the foregoing description is a preferred embodiment of the disclosed device and that various changes and modifications may be made in the invention without departing from the spirit and scope thereof.

What is claimed is:

1. A power combiner comprising:
   a plurality of power amplifiers which are even-numbered;
   a plurality of series-connected branch circuits for respectively distributing input power to said plurality of power amplifiers; and
   a plurality of series-connected combiners for combining the respective output power of said plurality of power amplifiers;

wherein in the case of at least one of such combinations as to equalize electric lengths of transmission lines for connecting between two power amplifiers selected from said plurality of power amplifiers, said combinations each being established by using all of said plurality of power amplifiers once, said electric lengths at which said at least one of the combinations is established, take $\lambda/2i$ (where $\lambda$=wavelength of fundamental wave, and i=positive integer), so as to enable cancellation of at least one harmonic component of odd-order harmonic components.

2. The power combiner according to claim 1, wherein said branch circuits are directional couplers respectively and the input power distributed to said plurality of power amplifiers are distributed so as to be substantially uniformly held at said plurality of power amplifiers.

3. The power combiner according to claim 1, wherein the electric lengths at which said at least one of said combinations is established, have electric lengths other than the shortest electric length, which are $\lambda/4$.

4. The power combiner according to claim 1, further comprising short stubs respectively having electric lengths of $\lambda/4$ (where $\lambda$=wavelength of a fundamental wave), which are provided at output terminals of said plurality of power amplifiers.

5. The power combiner according to claim 4, wherein the electric lengths at which said at least one of said combinations is established, have electric lengths other than the shortest electric length, which are $\lambda/4$.

6. A power combiner, comprising:
a plurality of power amplifiers which are connected in parallel and even-numbered;
a plurality of branch circuits for respectively distributing input power to said plurality of power amplifiers; and
a plurality of combiners for combining respective output power of said plurality of power amplifiers;
wherein in the case of at least one of such combinations as to equalize electric lengths of transmission lines for connecting between adjacent two power amplifiers selected from said plurality of power amplifiers and equalize electric lengths of transmission lines for connecting between non-adjoining two power amplifiers from said plurality of power amplifiers, said combinations each being established by using all of said plurality of power amplifiers once, said electric lengths allowing the establishment of said at least one of said combinations take $\lambda/2i$ (where $\lambda$=wavelength of fundamental wave, and i=positive integer), so as to enable cancellation of at least one harmonic component of odd-order harmonic components.

7. The power combiner according to claim 6, wherein said branch circuits are directional couplers respectively and the input power distributed to said plurality of power amplifiers are distributed so as to be substantially uniformly held at said plurality of power amplifiers.

8. The power combiner according to claim 6, wherein said electric lengths allowing the establishment of said at least one of said combinations take $\lambda/4$.

9. A linearized power amplifier, comprising:
a main power amplifier for amplifying a main signal;
an error signal detection circuit for combining the main signal amplified by said main power amplifier with the pre-amplification main signal to thereby extract an error signal;
an error signal amplifier for amplifying the error signal;
a distortion elimination circuit for combining said amplified error signal with said amplified main signal to thereby eliminate distortion of said amplified main signal; and a control circuit for controlling said error detection circuit and said distortion elimination circuit;
wherein said main power amplifier has a plurality of power amplifiers which are even-numbered, a plurality of series-connected branch circuits for respectively distributing input power to said plurality of power amplifiers, and a plurality of series-connected combiners for combining respective output power of said plurality of power amplifiers, and in the case of at least one of such combinations as to equalize electric lengths of transmission lines for connecting between two power amplifiers selected from said plurality of power amplifiers, said combinations each being established by using all of said plurality of power amplifiers once, said electric lengths at which said at least one of said combinations is established, take $\lambda/2i$ (where $\lambda$=wavelength of fundamental wave, and i=positive integer);
whereby the main signal amplified by said main power amplifier is combined with said pre-amplification main signal without being processed via a harmonic elimination filter.

10. A radio base station, comprising:
modulation demodulation equipment for converting each of signals lying within a base band to each of signals lying within a carrier frequency band;
a main power amplifier for amplifying the signal lying in said carrier frequency band;
an error signal detection circuit for combining the signal amplified by said main power amplifier, which is lying within the carrier frequency band, and the preamplification signal lying within the carrier frequency band to thereby extract an error signal;
an error signal amplifier for amplifying the error signal;
a distortion elimination circuit for combining said amplified error signal with said amplified signal lying within the carrier frequency band to thereby eliminate distortion of said amplified signal lying within the carrier frequency band; and
a control circuit for controlling said error signal detection circuit and said distortion elimination circuit; and
an array antenna for outputting the amplified signal lying within the carrier frequency band as a radio wave having directivity;
wherein said main power amplifier has a plurality of power amplifiers which are even-numbered, a plurality of series-connected branch circuits for respectively distributing input power to said plurality of power amplifiers, and a plurality of series-connected combiners for combining respective output power of said plurality of power amplifiers, and in the case of at least one of such combinations as to equalize electric lengths of transmission lines for connecting between two power amplifiers selected from said plurality of power amplifiers, said combinations each being established by using all of said plurality of power amplifiers once, said electric lengths at which said at least one of said combinations is established, take $\lambda/2i$ (where $\lambda$=wavelength of fundamental wave, and i=positive integer);
whereby the signal amplified by said main power amplifier lying within the carrier frequency band is combined with said pre-amplification signal lying within the carrier frequency band without being processed via a harmonic elimination filter.

11. A power combiner, comprising:

a plurality of power amplifiers which are even-numbered;

a plurality of series-connected branch circuits for respectively distributing input power to said plurality of power amplifiers;

a plurality of series-connected combiners for combining respective output power of said plurality of power amplifiers;

open stubs respectively having electric lengths of $\lambda/12$ (where $\lambda$=wavelength of a fundamental wave), which are provided at matching terminators of said plurality of combiners; and inductors coupled in parallel with said open stubs respectively;

wherein in the case of at least one of such combinations as to equalize electric lengths of transmission lines for connecting between two power amplifiers selected from said plurality of power amplifiers, said combinations each being established by using all of said plurality of power amplifiers once, said electric lengths at which said at least one of said combinations is established, take $\lambda/2i$ (where i=positive integer).

12. The power combiner according to claim 11, wherein the electric lengths at which said at least one of said combinations is established, have electric lengths other than the shortest electric length, which are $\lambda/4$.

13. The power combiner according to claim 1, wherein the plurality of power amplifiers, the plurality of series-connected branch circuits and the plurality of series-connected combiners are combined so as to enable cancellation of at least one harmonic component of even-order and odd-order harmonic components.

14. The power combiner according to claim 6, wherein the plurality of power amplifiers, the plurality of branch circuits and the plurality of combiners are combined so as to enable cancellation of at least one harmonic component of even-order and odd-order harmonic components.

* * * * *